(12) United States Patent
Wang et al.

(10) Patent No.: US 11,417,838 B2
(45) Date of Patent: Aug. 16, 2022

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Wei Chen, Tainan (TW); Po-Kai Hsu, Tainan (TW); Yu-Ping Wang, Hsinchu (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 210 days.

(21) Appl. No.: 16/884,060

(22) Filed: May 27, 2020

(65) Prior Publication Data

US 2021/0343935 A1 Nov. 4, 2021

(30) Foreign Application Priority Data

Apr. 30, 2020 (CN) .......................... 202010360779.3

(51) Int. Cl.
*H01L 43/12* (2006.01)
*H01F 10/32* (2006.01)
*H01L 43/02* (2006.01)

(52) U.S. Cl.
CPC ........... *H01L 43/12* (2013.01); *H01F 10/329* (2013.01); *H01F 10/3254* (2013.01); *H01L 43/02* (2013.01)

(58) Field of Classification Search
CPC ..... H01L 43/12; H01L 43/02; H01F 10/3254; H01F 10/329
See application file for complete search history.

(56) References Cited

U.S. PATENT DOCUMENTS

| 7,728,384 | B2 | 6/2010 | Ho et al. |
| 9,230,626 | B2 | 1/2016 | Buhrman et al. |
| 2020/0324283 | A1* | 10/2020 | Braganca ................ B01L 3/502 |
| 2022/0013580 | A1* | 1/2022 | Manfrini ............... H01L 23/528 |

* cited by examiner

*Primary Examiner* — Douglas W Owens
(74) *Attorney, Agent, or Firm* — Winston Hsu

(57) ABSTRACT

A method for fabricating a semiconductor device includes the steps of: forming a first inter-metal dielectric (IMD) layer on a substrate; forming a first metal interconnection and a second metal interconnection in the first IMD layer; forming a channel layer on the first metal interconnection and the second metal interconnection; forming a magnetic tunneling junction (MTJ) stack on the channel layer; and removing the MTJ stack to form a MTJ.

10 Claims, 8 Drawing Sheets

US 11,417,838 B2

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: forming a first inter-metal dielectric (IMD) layer on a substrate; forming a first metal interconnection and a second metal interconnection in the first IMD layer; forming a channel layer on the first metal interconnection and the second metal interconnection; forming a magnetic tunneling junction (MTJ) stack on the channel layer; and removing the MTJ stack to form a MTJ.

According to another aspect of the present invention, a semiconductor device includes: a first metal interconnection and a second metal interconnection on a substrate; a first inter-metal dielectric (IMD) layer around the first metal interconnection and the second metal interconnection; a channel layer on the first IMD layer, the first metal interconnection, and the second metal interconnection; and a magnetic tunneling junction (MTJ) on the channel layer. Preferably, a sidewall of the channel layer includes a curve.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
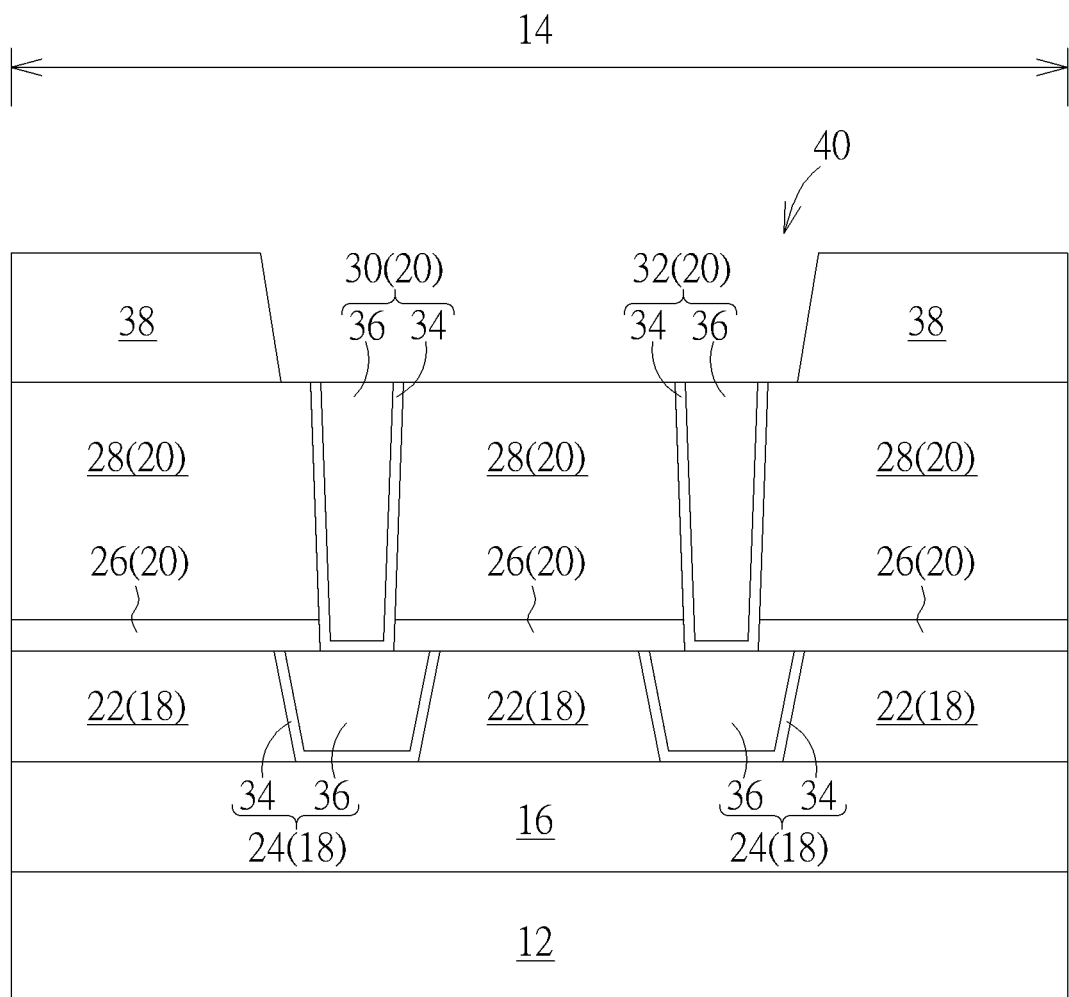
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 18, 20 are sequentially formed on the ILD layer 16 to electrically connect the aforementioned contact plugs, in which the metal interconnect structure 18 includes an inter-metal dielectric (IMD) layer 22 and metal interconnections 24 embedded in the IMD layer 22, and the metal interconnect structure 20 includes a stop layer 26, an IMD layer 28, and metal interconnections 30, 32 embedded in the stop layer 26 and the IMD layer 28.

In this embodiment, each of the metal interconnections 24 from the metal interconnect structure 18 preferably includes a trench conductor and each of the metal interconnections 30, 32 from the metal interconnect structure 20 includes a via conductor. Preferably, each of the metal interconnections 24, 30, 32 from the metal interconnect structures 18, 20 could be embedded within the IMD layers 22, 28 and/or stop layer 26 according to a single damascene process or dual damascene process. For instance, each of the metal interconnections 24, 30, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 24 are preferably made of copper, the metal layers 36 in the metal interconnections 30, 32 are preferably made of tungsten or copper, the IMD layers 22, 28 are preferably made of silicon oxide or ultra low-k (ULK) dielectric layer, and the stop layers 26 is preferably made of nitrogen doped carbide (NDC), silicon nitride, silicon carbon nitride (SiCN), or combination thereof.

Next, a dielectric layer 38 is formed on the IMD layer 28 and a photo-etching process is conducted to remove part of the dielectric layer 38 for forming an opening 40 exposing the metal interconnections 30, 32 and the IMD layer 28. In this embodiment, the dielectric layer 38 is preferably formed to accommodate a channel layer formed in the later process so that the thickness of the dielectric layer 38 is preferably maintained between 300 Angstroms to 1000 Angstroms. Preferably, the dielectric layer 38 could include silicon dioxide ($SiO_2$), silicon nitride (SiN), or silicon carbon nitride (SiCN) and most preferably include SiCN.

Figure 2:
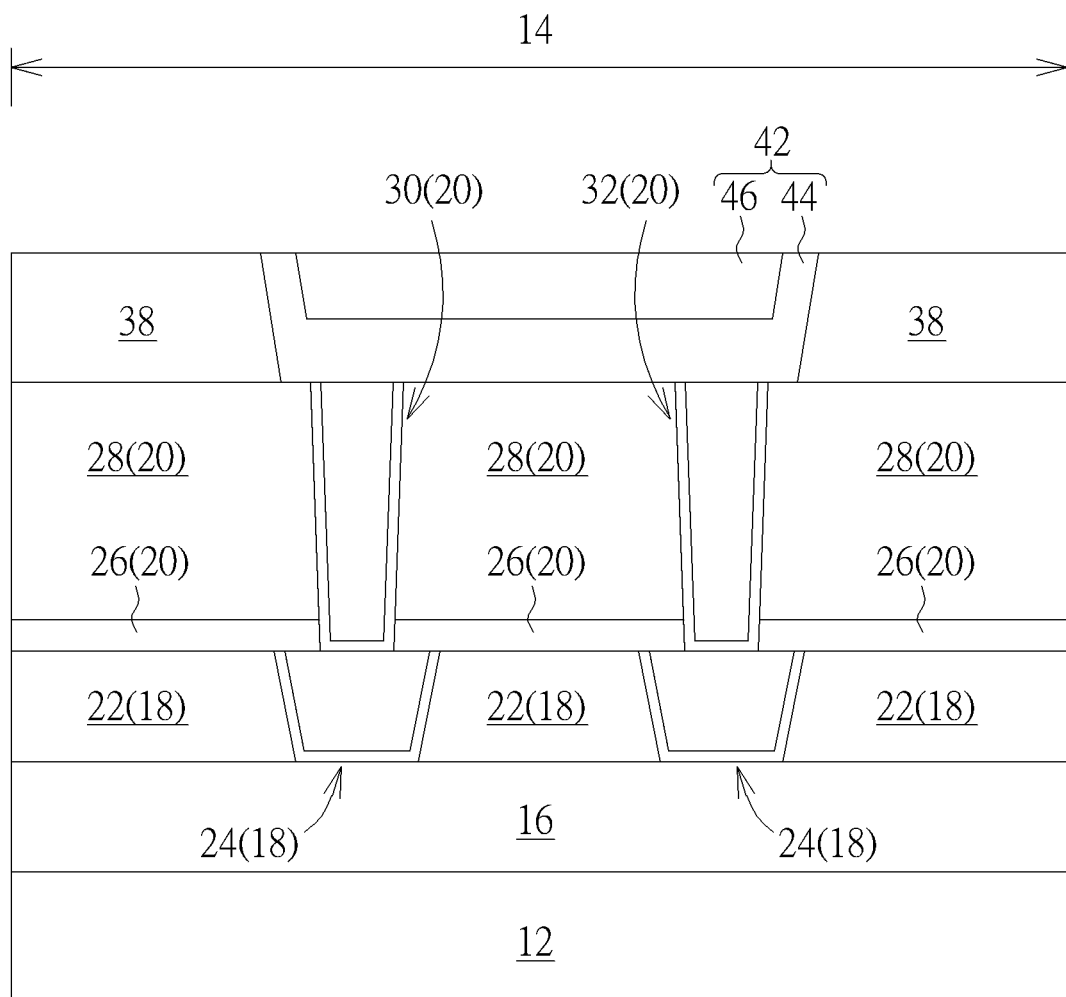

Next, as shown in FIG. 2, a channel layer 42 or more specifically a first channel layer 44 and a second channel layer 46 are formed into the opening 40 and on the dielectric layer 38 and a planarizing process such as chemical mechanical polishing (CMP) process is conducted to remove part of the second channel layer 46 and part of the first channel layer 44 so that the top surface of the remaining first channel layer 44 and second channel layer 46 is even with the top surface of the dielectric layer 38 as the first channel layer 44 includes a U-shape cross-section at this stage. In this embodiment, the first channel layer 44 and the second channel layer 46 are preferably made of different materials and/or materials having different etching rates for the ion beam etching (IBE) process conducted afterwards. For instance, the first channel layer 44 on the lower level is preferably made of material having higher resistance to etching process or with lower etching rate while the second channel layer 46 on the higher level is made of material having lower resistance to etching process or with higher etching rate. In this embodiment, the first channel layer 44 is preferably made of topological insulators including but not limited to for example bismuth selenide ($Bi_xSe_{1-x}$) while the second channel layer 46 could include heavy metal such as tantalum (Ta), tungsten (W), platinum (Pt), hafnium (Hf), or combination thereof. Moreover, the first channel layer 44 and the second channel layer 46 preferably have different thicknesses, in which the thickness ratio of the first channel layer 44 to the second channel layer 46 is between 0.5 to 5. For instance, the thinnest portion of the first channel layer 44 is approximately half the thickness of the second channel layer 46 while the thickest portion of the first channel layer 44 is about 5 times the thickness of the second channel layer 46.

Figure 3:
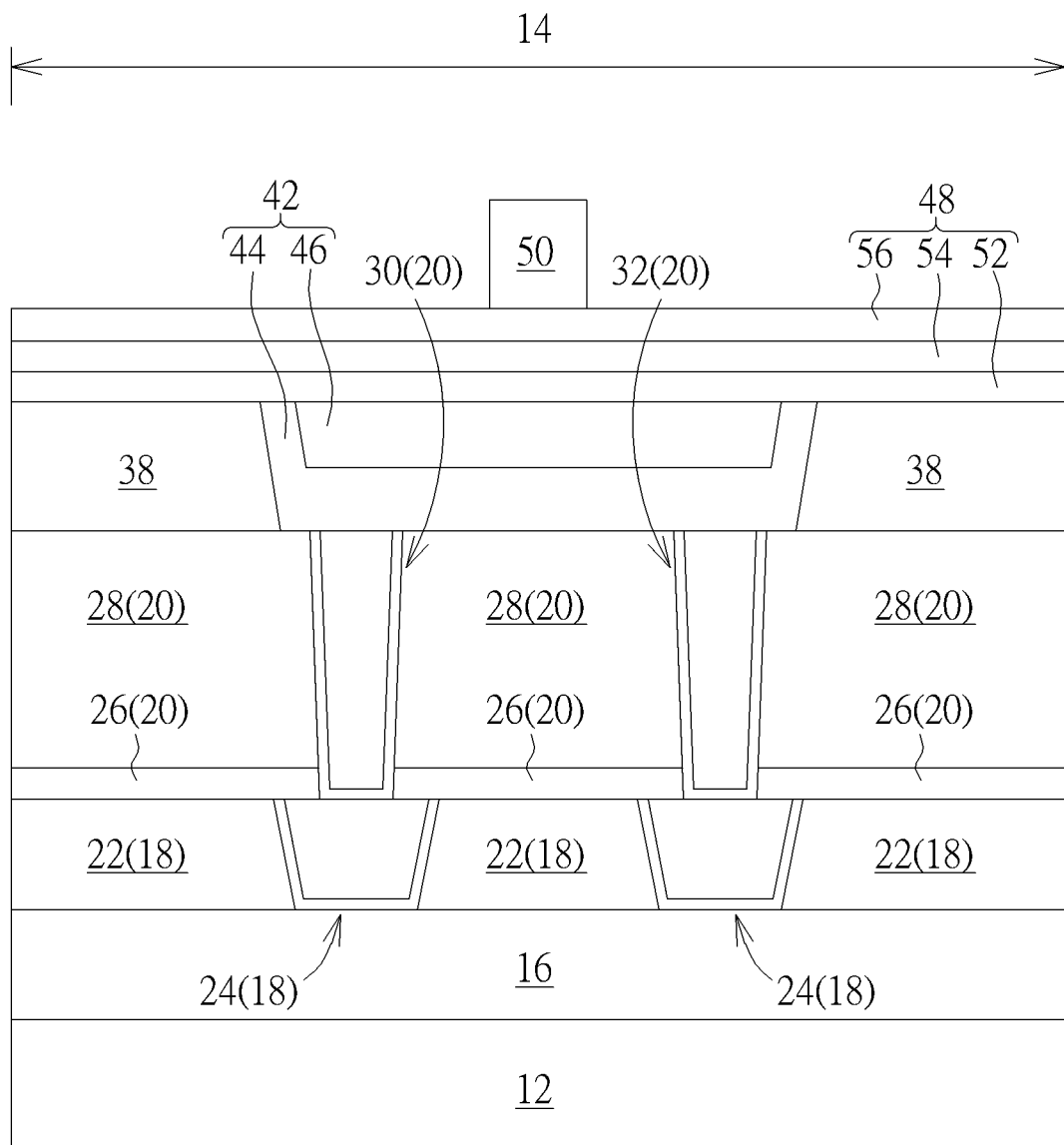

Next, as shown in FIG. 3, a MTJ stack 48 or stack structure is formed on the channel layer 42 and the dielectric layer 38 and a patterned hard mask 50 is formed on the MTJ stack 48. In this embodiment, the formation of the MTJ stack 48 could be accomplished by sequentially depositing a free layer 52, a barrier layer 54, and a pinned layer 56 on the channel layer 42. Preferably, the free layer 52 could be made of ferromagnetic material including but not limited to for example iron, cobalt, nickel, or alloys thereof such as cobalt-iron-boron (CoFeB), in which the magnetized direction of the free layer 52 could be altered freely depending on the influence of outside magnetic field. The barrier layer 54 could be made of insulating material including but not limited to for example oxides such as aluminum oxide ($AlO_x$) or magnesium oxide (MgO). The pinned layer 56 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 56 is formed to fix or limit the direction of magnetic moment of adjacent layers. It should be noted that since the present embodiment pertains to fabricating a SOT MRAM device, the free layer 52 is preferably disposed on the bottommost layer to contact the channel layer 42 directly. Preferably, the patterned mask 50 could include conductive material including but not limited to for example metal or metal nitride, in which metal could include titanium (Ti) while metal nitride could include titanium nitride (TiN).

Figure 4:
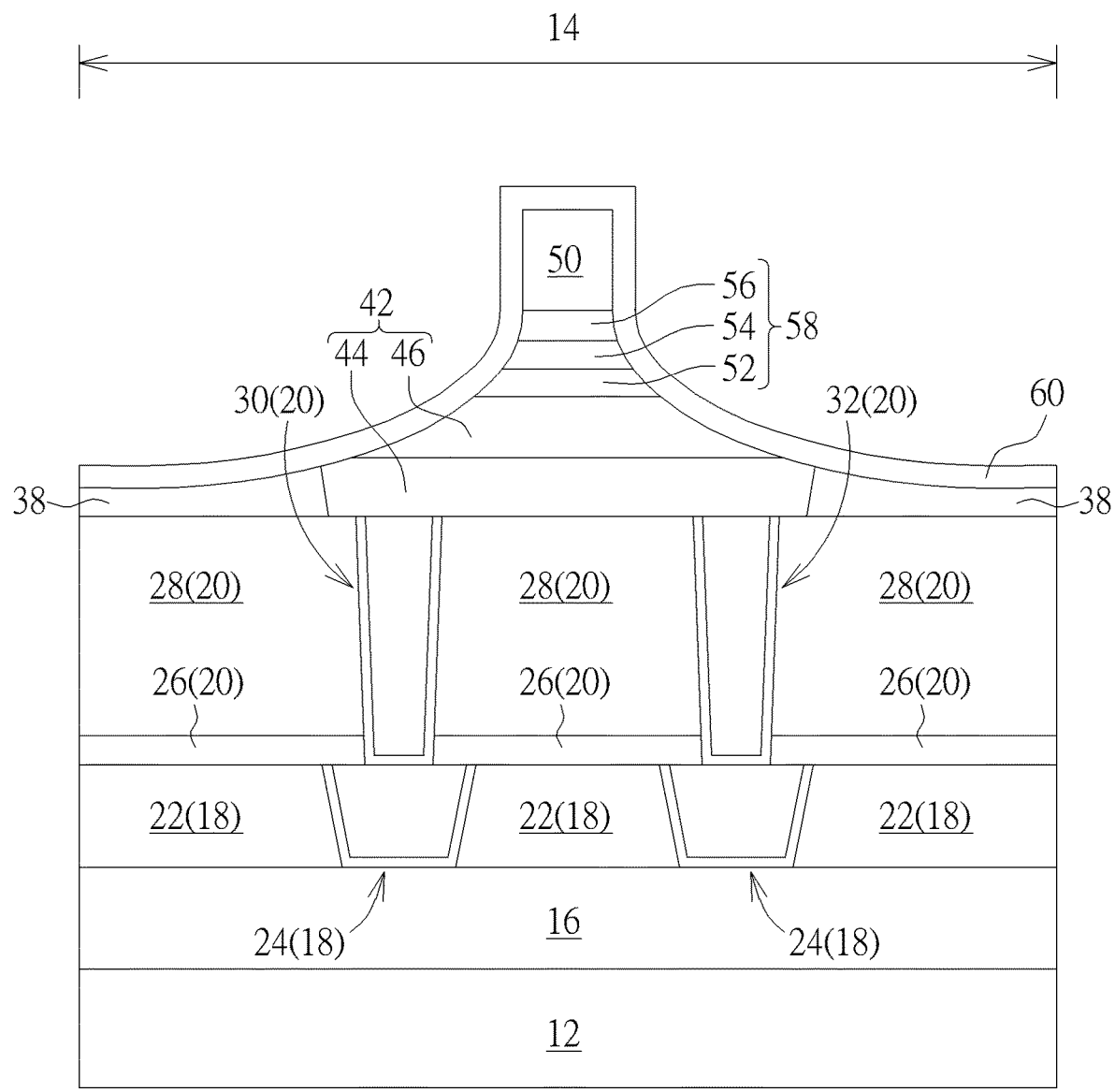

Next, as shown in FIG. 4, one or more etching process is conducted by using the patterned hard mask 50 as mask to remove part of the MTJ stack 48, part of the second channel layer 46, part of the first channel layer 44, and part of the dielectric layer 38 for forming a MTJ 58 on the MRAM region 14, and a cap layer 60 is formed on the surface of the hard mask 50, MTJ 58, second channel layer 46, first channel layer 44, and dielectric layer 38. It should be noted that a reactive ion etching (ME) process and/or an ion beam etching (IBE) process could be conducted to pattern the MTJ stack 48 and due to the characteristics of the IBE process, sidewalls of the MTJ 58, sidewalls of the second channel layer 46, sidewalls of the first channel layer 44, and top surface of the remaining dielectric layer 38 could all reveal a curve or an arc as the top surface of the part of the dielectric layer 38 could be slightly lower than the top surface of the first channel layer 44. Preferably, the cap layer 60 could include nitrogen doped carbide (NDC), silicon nitride (SiN), silicon carbon nitride (SiCN), or combination thereof and most preferably SiN.

Figure 5:
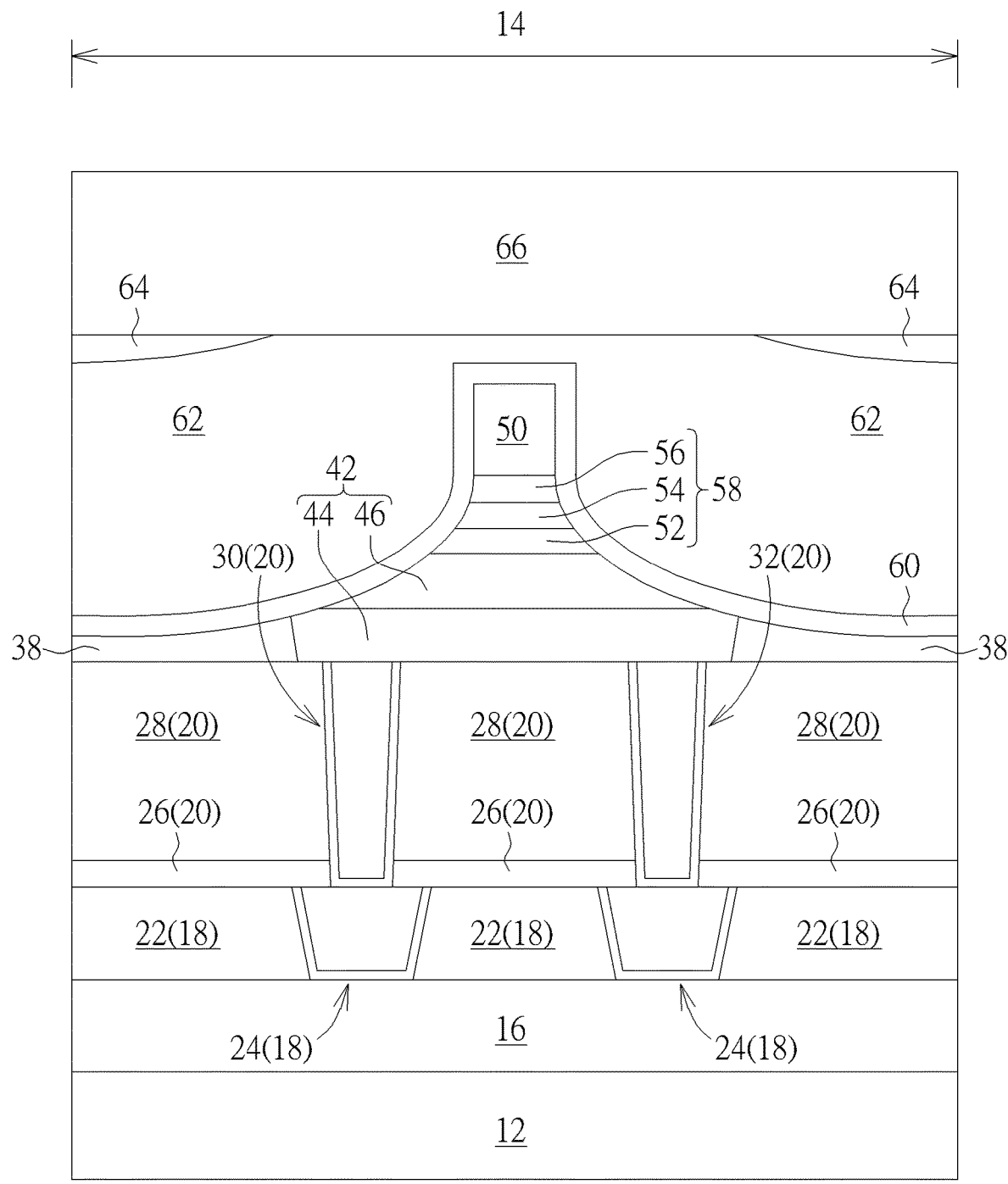

Next, as shown in FIG. 5, an IMD layer 62 and a stop layer 64 are formed on the cap layer 60, a planarizing process such as CMP is conducted to remove part of the stop layer 64 and part of the IMD layer 62, and another IMD layer 66 is formed on the stop layer 64 thereafter. In this embodiment, the IMD layers 62, 64 preferably include an ultra low-k (ULK) dielectric layer including but not limited to for example porous material or silicon oxycarbide (SiOC) and the stop layer 64 preferably includes nitrogen doped carbide (NDC), silicon nitride (SiN), silicon carbon nitride (SiCN), or combination thereof and most preferably SiN.

Figure 6:
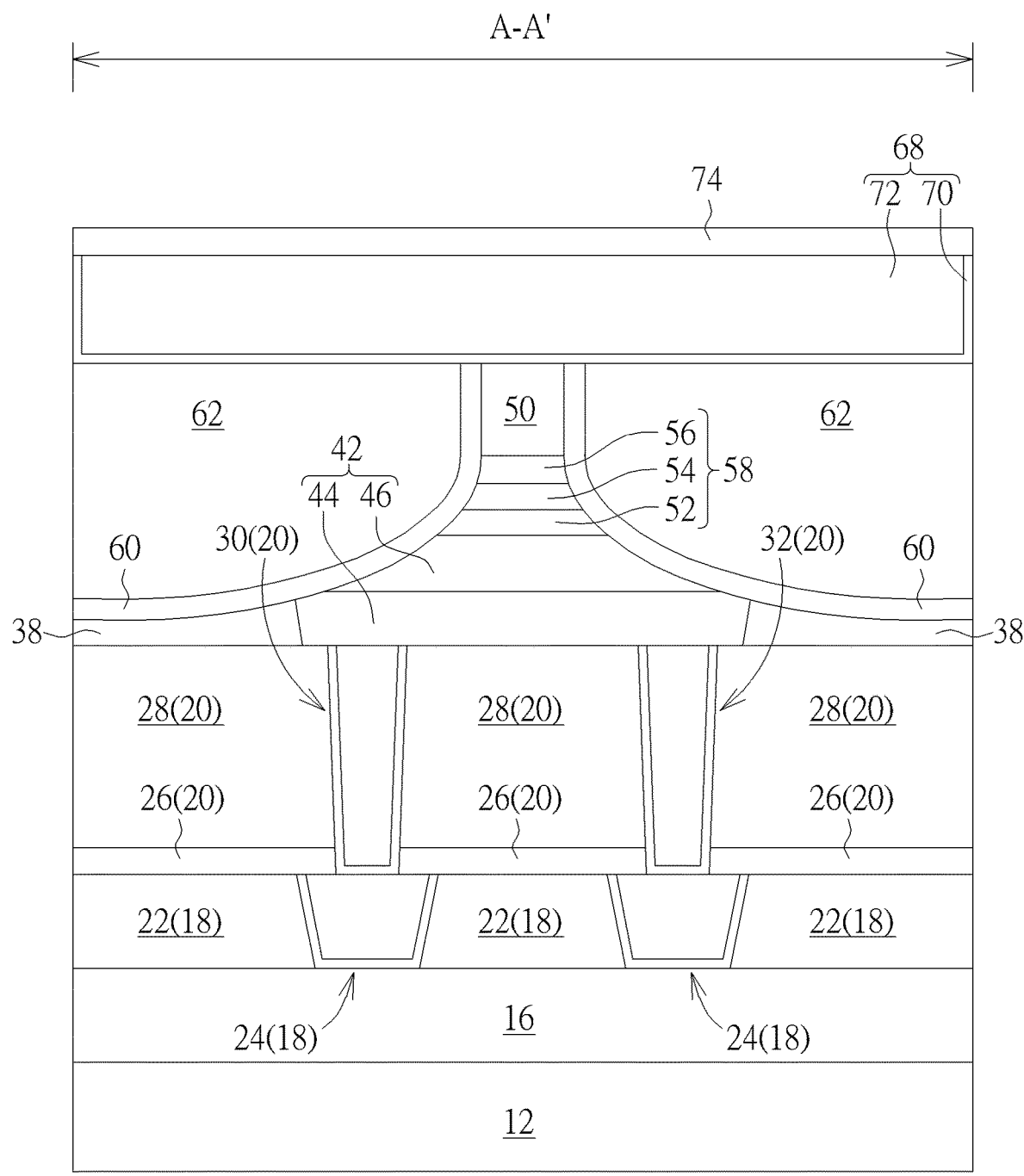

Next, as shown in FIG. 6, one or more photo-etching process is conducted to remove part of the IMD layer 66, part of the stop layer 64, and part of the IMD layer 62 to form at least a contact hole (not shown) exposing the hard mask 50. Next, conductive materials are deposited into the contact hole and planarizing process such as CMP is conducted to form metal interconnection 68 connecting the hard mask 50 underneath, and another stop layer 74 is formed on the surface of the metal interconnections 68 thereafter. Similar to the aforementioned metal interconnections 24, the metal interconnection 68 could be embedded within the IMD layers 62, 66 according to a single damascene process or dual damascene process. For instance, the metal interconnection 68 could further include a barrier layer 70 and a metal layer 72, in which the barrier layer 70 could be selected from the group consisting of titanium (Ti), titanium nitride (TiN), tantalum (Ta), and tantalum nitride (TaN) and the metal layer 72 could be selected from the group consisting of tungsten (W), copper (Cu), aluminum (Al), titanium aluminide (TiAl), and cobalt tungsten phosphide (CoWP). In this embodiment, the metal layer 72 in the metal interconnection 68 preferably includes copper and the stop layer 74 preferably includes nitrogen doped carbide (NDC), silicon nitride (SiN), silicon carbon nitride (SiCN), or combination thereof and most preferably SiCN. This completes the fabrication of a semiconductor device according to an embodiment of the present invention.

Figure 7:
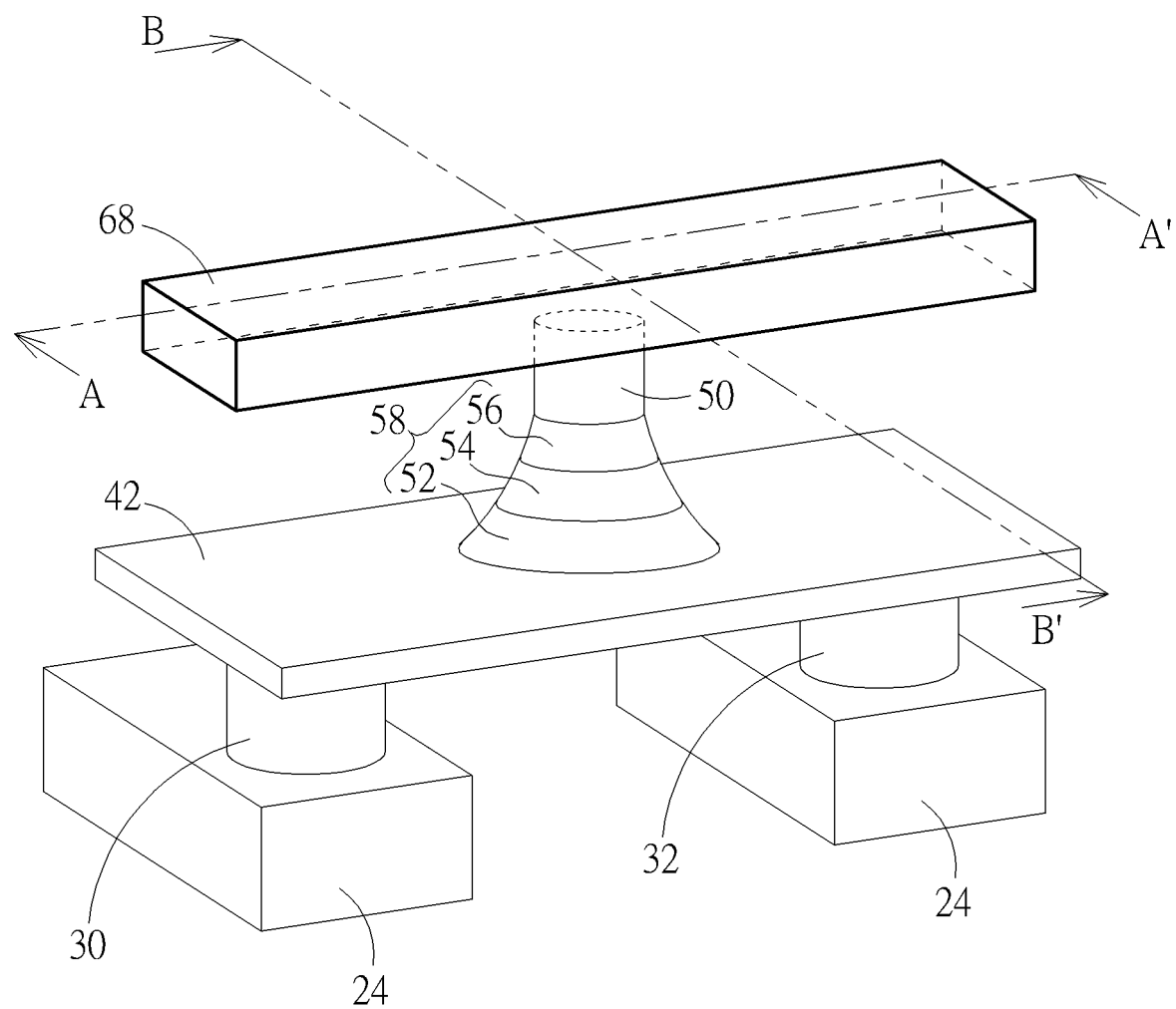
FIG. 7 illustrates a 3-dimensional structural view of two MRAM units arranged in an array according an embodiment of the present invention.
Figure 8:
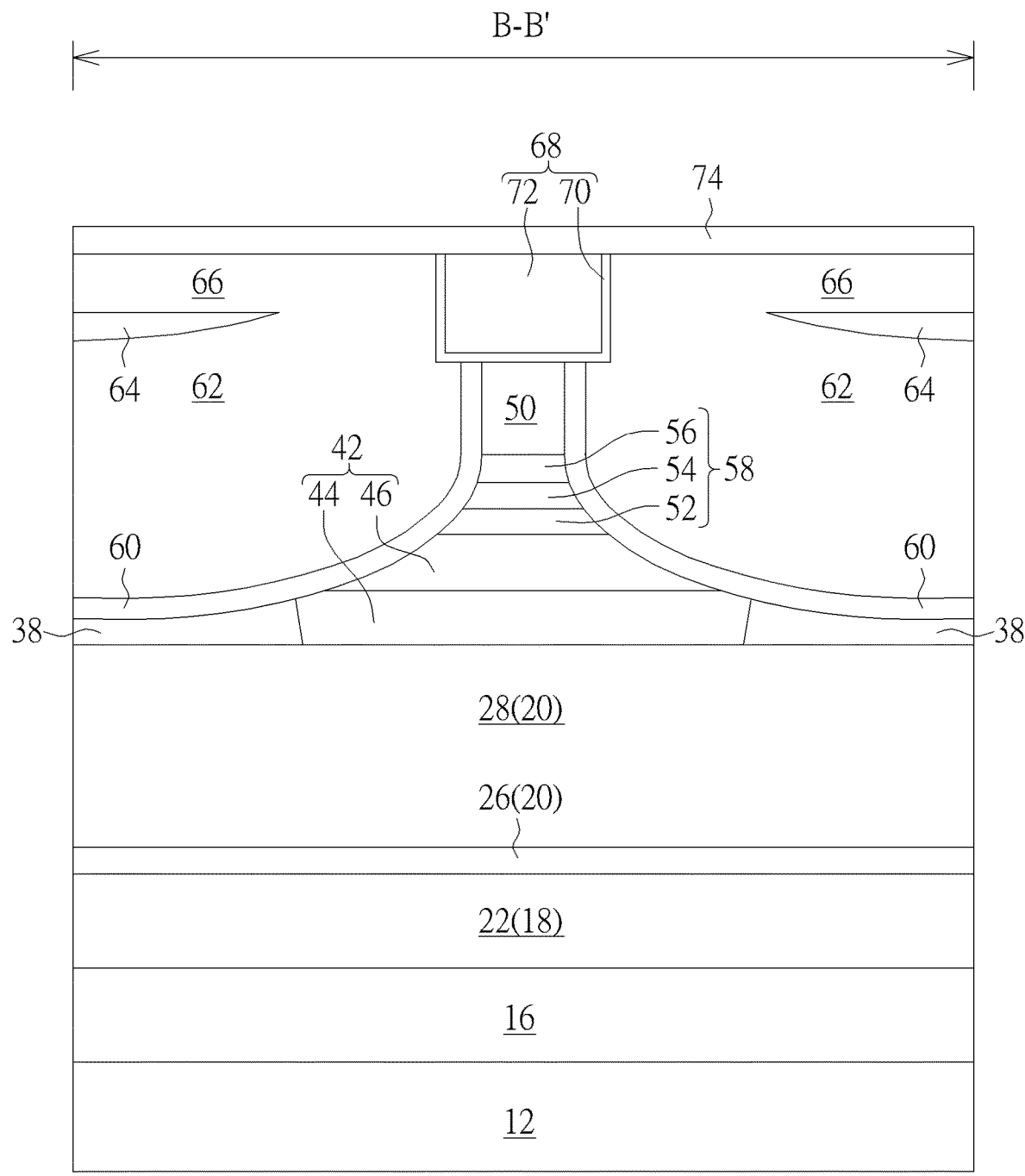
FIG. 8 illustrates a cross-section view of FIG. 7 taken along the sectional line BB'.

Referring to FIGS. 6-8, in which FIG. 7 illustrates a 3-dimensional structural view of two MRAM units arranged in an array according an embodiment of the present invention, FIG. 6 illustrates a cross-section view of FIG. 7 taken along the sectional line AA', and FIG. 8 illustrates a cross-section view of FIG. 7 taken along the sectional line BB'. As shown in FIGS. 6-8, the MRAM unit preferably includes metal interconnections 30 and 32 disposed on the substrate 12, an IMD layer 28 surrounding the metal interconnections 30, 32, a channel layer 42 disposed on the IMD layer 28 and the metal interconnections 30, 32, and a MTJ 58 disposed on the channel layer 42. Preferably, the channel layer 42 further includes a first channel layer 44 disposed on and directly contacting two metal interconnections 30, 32 at the same time and a second channel layer 46 disposed on the first channel layer 44, a dielectric layer 38 is disposed surrounding the first channel layer 44 and at least a sidewall of the channel layer 42 includes a curve or curves surface.

Viewing from a more detailed perspective, at least a sidewall of the MTJ 58, at least a sidewall of the second channel layer 46, at least a sidewall of the first channel layer 44, and the top surface of the dielectric layer 38 could include one or more than one curve or curved surface, in which the curve of the sidewall of the MTJ 58, the curve of the sidewall of the second channel layer 46, the curve of the sidewall of the first channel layer 44, and the curve of the top surface of the dielectric layer 38 preferably constitute a continuous curve. Moreover, in contrast the bottom surface of the channel layer 42 directly contacting the metal interconnections 30, 32 in FIG. 6, the channel layer 42 shown in FIG. 8 only contacts the IMD layer 28 and the IMD layers 62, 66 and the stop layer 64 are disposed adjacent to two sides of the metal interconnection 68 as the stop layer 64 is embedded in the IMD layers 62, 66 without contacting the metal interconnection 68 directly.

In contrast to current MRAM devices of utilizing a spin torque transfer (STT) approach for switching magnetic moments, the present invention pertains to fabricate a spin orbit torque (SOT) MRAM device that principally uses SOT effect to switch the magnetic moment within the free layer, or more specifically induces switching of the free layer of the MTJ by injecting an in-plane current in an adjacent SOT layer (or the aforementioned channel layer), typically with the assistance of the state in-plane magnetic field. This enables a three terminal MTJ-based concept that isolates the read/write path, significantly improving the device endurance and read stability.

Under actual fabrication, the present invention preferably employs a damascene process to first form a dielectric layer 38 on the metal interconnections, removes part of the dielectric layer to form an opening exposing the metal interconnections underneath, forms two layers of channel layers made of different materials into the opening, and then forms a MTJ on the channel layers. Preferably, the first channel layer 44 on the bottom is made of topological insulators including but not limited to for example bismuth selenide ($Bi_xSe_{1-x}$) while the second channel layer 46 on the top could include heavy metal such as tantalum (Ta), tungsten (W), platinum (Pt), hafnium (Hf), or combination thereof.

Since the switching of SOT MRAM is typically achieved by spin current affecting the magnetic moment of the free layer instead of providing current to the device directly, side effect such as reduction of coercivity in the magnetic layers, heating up of the entire MTJ by current, and continuous punch-through of insulating layer could be prevented during write operation of the device. Moreover since the spin current applies equal magnetic field to the entire magnetic layers at the same time so that the chance of switching is only determined by the magnitude of the current pulse applied, it would be desirable to boost up the speed of current plasma applied to the SOT devices than conventional STT devices thereby improving the write speed of the device significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first metal interconnection and a second metal interconnection on a substrate;
   a first inter-metal dielectric (IMD) layer around the first metal interconnection and the second metal interconnection;
   a channel layer on the first IMD layer, the first metal interconnection, and the second metal interconnection, wherein a sidewall of the channel layer comprises a curve; and
   a magnetic tunneling junction (MTJ) on the channel layer.

2. The semiconductor device of claim 1, wherein the channel layer comprises:
   a first channel layer on the first metal interconnection and the second metal interconnection; and
   a second channel layer on the first channel layer.

3. The semiconductor device of claim 2, wherein a sidewall of the first channel layer comprises a first curve.

4. The semiconductor device of claim 2, wherein a sidewall of the second channel layer comprises a second curve.

5. The semiconductor device of claim 2, further comprising a dielectric layer around the first channel layer.

6. The semiconductor device of claim 5, wherein a top surface of the dielectric layer comprises a third curve.

7. The semiconductor device of claim 2, wherein the first channel layer and the second channel layer comprise different materials.

8. The semiconductor device of claim 1, wherein a sidewall of the MTJ comprises a fourth curve.

9. The semiconductor device of claim 1, wherein the MTJ comprises:
   a free layer on the channel layer;
   a barrier layer on the free layer; and
   a pinned layer on the barrier layer.

10. The semiconductor device of claim 1, further comprising:
    a cap layer on the channel layer and adjacent to the MTJ; and
    a second IMD layer around the cap layer.

* * * * *